(12) United States Patent
Marsh et al.

(10) Patent No.: US 6,719,884 B2
(45) Date of Patent: Apr. 13, 2004

(54) METHOD OF MANUFACTURING OPTICAL DEVICES AND RELATED IMPROVEMENTS

(75) Inventors: John Haig Marsh, Glasgow (GB); Craig James Hamilton, Bishopton (GB); Olek Peter Kowalski, Paisley (GB); Stuart Duncan McDougall, Glasgow (GB); Xuefeng Liu, Glasgow (GB); Bo-Cang Qui, Glasgow (GB)

(73) Assignee: Intense Photonics Limited (GB)

( * ) Notice: Subject to any disclaimer, the term of this patent is extended or adjusted under 35 U.S.C. 154(b) by 0 days.

(21) Appl. No.: 10/047,308

(22) Filed: Jan. 15, 2002

(65) Prior Publication Data

US 2003/0053789 A1 Mar. 20, 2003

(30) Foreign Application Priority Data

Sep. 13, 2001 (GB) .............................................. 0122182

(51) Int. Cl.$^7$ .......................... C23C 14/34; C23C 14/30; C23C 8/00; B05D 5/06
(52) U.S. Cl. .................. 204/192.26; 427/162; 427/596; 427/585
(58) Field of Search ..................... 204/192.26; 427/162, 427/596, 585

(56) References Cited

U.S. PATENT DOCUMENTS

| | | | |
|---|---|---|---|
| 4,282,494 A | 8/1981 | Yonezu et al. | 331/94.5 H |
| 4,511,408 A | 4/1985 | Holonyak, Jr. | 372/44 |
| 4,585,491 A | 4/1986 | Burnham et al. | 148/1.5 |
| 4,594,603 A | 6/1986 | Holonyak, Jr. | 357/16 |
| 4,639,275 A | 1/1987 | Holonyak, Jr. | 148/1.5 |
| 4,727,556 A | 2/1988 | Burnham et al. | 372/50 |
| 4,845,216 A | 7/1989 | Taylor et al. | 544/279 |
| 4,845,727 A | 7/1989 | Murray | 377/43 |
| 4,857,971 A | 8/1989 | Burnham | 357/4 |
| 4,871,690 A | 10/1989 | Holonyak, Jr. et al. | 437/105 |
| 5,238,868 A | 8/1993 | Elman et al. | 437/126 |
| 5,376,583 A | 12/1994 | Northrup et al. | 437/133 |
| 5,384,797 A | 1/1995 | Welch et al. | 372/23 |
| 5,403,774 A | 4/1995 | Shieh et al. | 437/129 |
| 5,525,541 A | 6/1996 | Krauz et al. | 437/161 |
| 5,766,981 A | 6/1998 | Thornton et al. | 438/36 |
| 5,843,802 A | 12/1998 | Beernick et al. | 438/45 |
| 6,027,989 A | 2/2000 | Poole et al. | 438/522 |

FOREIGN PATENT DOCUMENTS

| | | | |
|---|---|---|---|
| EP | 0 660 380 A2 | 6/1995 | H01L/21/22 |
| EP | 0 660 380 A3 | 1/1996 | H01L/21/22 |

OTHER PUBLICATIONS

Suzuki et al., "Fabrication of GaAIAs 'Window–Stripe' Multi–Quantum–Well Heterostructure Lasers Utilising Zn Diffusion–Induced Alloying", Electronics Letters, Apr. 26, 1984, vol. 20, No. 9, pp. 383–384.

Thornton et al., "Highly efficient, long lived AIGaAs lasers fabricated by silicon impurity induced disordering", Appl. Phys. Lett., 49 (3), Jul. 21, 1986, pp. 133–134.

Hamilton et al., "Bandgap tuning of visible laser material", Mar. 5, 1998, Electronics Letters, vol. 34, No. 7, pp. 665–666, Apr. 2, 1998.

Carpenter et al., "SIMS analysis of InGaAs/InA1GaAs wafers—Report No. SI/GLU/6725", Institute of Surface Science and Technology, Loughborough University, Apr. 27, 1998, 26 pgs.

Marsh et al., "Monolithic integration in III–V semiconductors via a universal damage enhanced quantum well intermixing technique", Part of the SPIE Conference on Materials Modification by Ion Irradiation, Quebec, Canada, Jul. 1998, SPIE vol. 3413, 9 pgs.

Saher, Helmy A., "Micro Raman studies of disordering due to dielectric cap annealing in GaAs/AlGaAs heterostructures; A Progress Report", May 5, 1998, 23 pgs.

McDougall et al., "Monolithic Integration via a Universal Damage Enhanced Quantum–Well Intermixing Technique", IEEE Journal of Selected Topics in Quantum Electronics, vol. 4, No. 4, Jul./Aug. 1998.

Helmy et al., "Quantitative Model for the Kinetics of Compositional Intermixing in GaAs–AlGaAs Quantum–Confined Heterostructures", IEEE Journal of Selected Topics in Quantum Electronics, vol. 4, No. 4, pp. 653–660, Jul./Aug. 1998.

Ke et al., "The electronic structure and optical properties of intermixed GaAs/AlGaAs double quantum wells", Journal of Applied Physics, vol. 84, No. 5, pp. 2855–2857, Sep. 1, 1998.

Li et al., "Silica capping for AI 0.3Ga 0.7 As/GaAs and In0.2Ga0.8As/GaAs quantum well intermixing", Applied Physics Letters, vol. 73, No. 23, pp. 3393–3395, Dec. 7, 1998.

Helmy et al., "Control of silica cap properties by oxygen plasma treatment for single–cap selective impurity free vacancy disordering", Applied Physics Letters, vol. 74, No. 5, pp. 732–734, Feb. 1, 1999.

McDougall et al., "GaAs/AlGaAs waveguide pin photodiodes with non–absorbing input facets fabricated by quantum well intermixing", Electronics Letters, vol. 36, No. 8, pp. 749–750, Apr. 13, 2000.

Liu et al., "Fabrication of Monolithically Integrated Mach–Zender Asymmetric Interferometer Switch", IEEE 2000, pp. 412–414.

(List continued on next page.)

Primary Examiner—Steven H. VerSteeg
(74) Attorney, Agent, or Firm—Piper Rudnick LLP; Jefferson Perkins

(57) ABSTRACT

A method of manufacturing an optical device, wherein the device body portion from which the device is to be made includes at least one Quantum Well, the method including the step of causing an impurity material including copper to intermix with the Quantum Well.

21 Claims, 14 Drawing Sheets

OTHER PUBLICATIONS

"A13764 Al-quat MQW structure: Intermixing PL shifts recorded for control sample sputterred on week 1 and annealed each week", 4 pgs.

"Intermixing Process control meeting: Effect of change of control TC from edge to centre", 1 pg., Apr. 6, 2000.

Qui et al., "Monolithically Integrated Fabrication of 2x2 and 4x4 Crosspoint Switches Using Quantum Well Intermixing", pp. 415–418, IEEE 2000.

Ke et al., "Monolithically integrated distributed Bragg reflector lasers for 1.5 um operation with band gap shifted grating section", Optical Materials 14 (2000), pp. 193–196.

McDougall et al., "Harmonic modelocking at up to 440GHz repetition rates in InGaAs–InAlGaAs quantum well lasers", Department of Electronics and Electrical Engineering, University of Glasgow.

Kowalski et al., "Monolithic integration in InGaAs–InAlGaAs optoelectronic devices for 1.55 um emission by quantum well intermixing", Department of Electronics and Electrical Engineering, University of Glasgow.

Marsh et al., "Quantum well intermixing in material systems for 1.5 um (invited)", J. Vac. Sci., Technol. A 16(2), pp. 810–816, Mar./Apr. 1998.

Camacho et al., "Laser structure for generating high optical power in a singlemode waveguide", Electronics Letters, vol. 34, No. 5, pp. 460–461, Mar. 5, 1998.

Liu et al., "Control of Multiple Bandgap Shifts in InGaAs–AlInGaAs Multiple–Quantum–Well Material Using Different Thicknesses of PECVD $SiO_2$ Protection Layers", IEEE Photonics Technology Letters, vol. 12, No. 9, pp. 1141–1143, Sep. 2000.

K. McIlvaney et al., "Far–field behaviour of 980nm board area lasers incorporating bandgap widened extended slab waveguides", Electronics Letters Online, Oct. 26, 1994.

Y. H. Qian et al., "Three Band–gap QW Intermixing in InP/InGaAs/InGaAsP System for Monolithically Integrated Optical Switch". LEOS Conference, Dec. 1, 1998, pp. 194–195.

O. P. Kowalski et al., "A universal damage induced technique for quantum well intermixing", Applied Physics letter, Feb. 2, 1998, vol. 72, No. 5. pp. 581–583.

B. C. Qiu et al., "Extended Cavity Lasers In InGaAs–InGaAsP and InGaAlP–GaAs Multi–Quantum Well Structure Using a Sputtered $SiO_2$ Technique", $10^{th}$ Intern. Conf. on Indium Phosphide and Related Materials, May 11–15, 1998, pp. 635–637.

B. C. Qiu et al., "Precise Control of the Blue–shift of the Wavelength in InGaAs–InGaAsP Multiple Quantum Wells Using a Sputtered $SiO_2$ Technique", LEOS Conference, Nov. 8, 1999.

Kowalski et al., "Fabrication of narrow far–field InGaAs–InAlGaAs broad–area lasers using quantum well intermixed extended cavities", CLEO, Monday Morning, May 4, 1998, pp. 37–38.

PL shifts as a function of anneal temperature in InGaAs-InGaAsP for samples capped with PECVD SiO₂ and Cu:SiO₂

Typical Band gap shifts obtained using the copper intermixing process in InGaAs-InAlGAs Temperature dependent PL shifts obtained in GaAs-AlGaAs and GaInP-AlGaInP when capped with sputtered Cu:SiO₂. Over the same temperature range, negligible shifts are obtained for both materials when capped with PECVD SiO₂

Effect of removal of sputtered Cu:SiO₂ cap and replacement with PECVD SiO₂ in InAlGaAs MQW material Shifts in PL peak wavelength for InAlGaAs samples capped with sputtered SiO$_2$ and Cu:SiO$_2$, compared with samples capped with PECVD SiO$_2$ Band gap shifts obtained for InGaAs-InGaAsP MQW material after the deposition of sputtered Cu:SiO$_2$ for unprotected material and material protected with either 200nm of PECVD SiO$_2$ or 1800nm of photoresist SIMS profiles in InGaAsP MQW material capped with both PECVD SiO₂ and sputtered Cu:SiO₂ after a 680°C anneal. In and Ga out-diffusion is clearly observed for the sputter capped material but is not apparent in the PECVD SiO₂ cap.

SIMS profile of an unannealed InAlGaAs MQW sample after removal of a sputtered Cu:SiO₂ coating. The Cu concentration rapidly decreases to the noise limit of 5 x 10¹⁷ cm⁻³ at a depth of ~300nm SIMS profile of InAlGaAs sample after annealing at 700°C and stripping of the Cu:SiO$_2$ cap PL shifts obtained for InAlGaAs capped with PECVD $SiO_2$ sputtered $SiO_2$ and $Cu:SiO_2$ deposited in Intense Photonics sputtering system and sputtered $Cu:SiO_2$ deposited at the University of Glasgow Band gap shifts achieved through a SiO$_2$/Cu/SiO$_2$ multilayer deposition technique in InAlGaAs, where the second number refers to the deposition time for the copper layer and the first and third values refer to the thicknesses of the surrounding SiO$_2$ layers PL shifts in 980 nm material when capped with PECVD SiO₂ and with sputtered SiO₂/Cu/SiO₂ with varying thickness of the first SiO₂ layer thickness

METHOD OF MANUFACTURING OPTICAL DEVICES AND RELATED IMPROVEMENTS

FIELD OF INVENTION

This invention relates to a method of manufacturing of optical devices, and in particular, though not exclusively, to manufacturing integrated optical devices or optoelectronic devices, for example, semiconductor optoelectronic devices such as laser diodes, optical modulators, optical amplifiers, optical switches, optical detectors, and the like. The invention further relates to Optoelectronic Integrated Circuits (OEICs) and Photonic Integrated Circuits (PICs) including such devices.

The invention particularly, though not exclusively, relates to a method of manufacturing an optical device using a new and improved impurity induced Quantum Well Intermixing (QWI) process.

BACKGROUND TO INVENTION

Monolithic integration of different optical components onto a single epitaxial layer is highly desirable in optical communication systems. One of the fundamental demands for monolithic integration is to realise different semiconductor band-gaps within one epitaxial layer. For example, a 2×2 cross-point switch incorporating semiconductor optical amplifiers, passive waveguide splitters, and electro-absorption (EA) modulators typically requires three band-gaps. The operation wavelength for the switches, and therefore for the amplifiers, is typically 1.55 $\mu$m, but a much wider band-gap is required for the passive waveguides in order to minimize the absorption of light propagation along the waveguides. Moreover, the optimum absorption band-gap for the EA modulators is around 20–50 nm shorter than that of the amplifiers, to realise a low insertion loss and high extinction ratio. Multiband-gap energy structures also find applications in devices such as multiwavelength sources in WDM systems and photodetectors.

Many techniques are currently under investigation for such a purpose. Although those based on selective regrowth appear promising, expensive facilities such as Metal-Organic Chemical Vapor Deposition (MOCVD) are needed during the entire production process, and two-dimensional patterning of the band-gap is not possible. Other approaches are based on Quantum Well Intermixing (QWI).

Quantum Well Intermixing (QWI) is a process which has been reported as providing a possible route to monolothic optoelectronic integration. QWI may be performed in III–V semiconductor materials, eg Aluminium Gallium Arsenide (AlGaAs) and Indium Gallium Arsenide Phosphide (InGaAsP), which may be grown on binary substrates, eg Gallium Arsenide (GaAs) or Indium Phosphide (InP). QWI alters the band-gap of an as-grown structure through inter-diffusion of elements of a Quantum Well (QW) and associated barriers to produce an alloy of the constituent components. The alloy has a band-gap which is larger than that of the as-grown QW. Any optical radiation (light) generated within the QW where no QWI has taken place can therefore pass through a QWI or "intermixed" region of alloy which is effectively transparent to the said optical radiation.

Various QWI techniques have been reported in the literature. For example, QWI can be performed by high temperature diffusion of elements such as Zinc into a semiconductor material including a QW.

QWI can also be performed by implantation of elements such as silicon into a QW semiconductor material. In such a technique the implantation element introduces point defects in the structure of the semiconductor material which are moved through the semiconductor material inducing intermixing in the QW structure by a high temperature annealing step.

Such QWI techniques have been reported in "Applications of Neutral Impurity Disordering in Fabricating Low-Loss Optical Waveguides and Integrated Waveguide Devices", Marsh et al, Optical and Quantum Electronics, 23, 1991, s941–s957, the content of which is incorporated herein by reference.

A problem exists with such techniques in that, although the QWI will alter (increase) the band-gap of the semiconductor material post-growth, residual diffusion or implantation dopants can introduce large losses due to the free carrier absorption coefficient of these dopant elements.

A further reported QWI technique providing intermixing is Impurity Free Vacancy Diffusion (IFVD). When performing IFVD the top cap layer of the III–V semiconductor structure is typically GaAs or Indium Gallium Arsenide (InGaAs). Upon the top layer is deposited a Silica ($SiO_2$) film. Subsequent rapid thermal annealing of the semiconductor material causes bonds to break within the semiconductor alloy and Gallium ions or atoms, which are susceptible to Silica ($SiO_2$), to dissolve into the Silica so as to leave vacancies in the cap layer. The vacancies then diffuse through the semiconductor structure inducing layer intermixing, eg in the QW structure.

IFVD has been reported in "Quantitative Model for the Kinetics of Composition Intermixing in GaAs—AlGaAs Quantum "Confined Heterostructures", by Helmy et al, IEEE Journal of Selected Topics in Quantum Electronics, Vol. 4, No. 4, July/August 1998, pp 653–660, the content of which is incorporated herein by reference.

Reported QWI, and particularly IFVD methods, suffer from a number of disadvantages, eg the temperature at which Gallium out-diffuses from the semiconductor material to the Silica ($SiO_2$) film.

It is an object of at least one aspect of the present invention to obviate or at least mitigate at least one of the aforementioned disadvantages/problems in the prior art.

It is also an object of at least one aspect of the present invention to provide an improved method of manufacturing an optical device using an improved QWI process.

SUMMARY OF INVENTION

According to a first aspect of the present invention there is provided a method of manufacturing an optical device, a device body portion from which the device is to be made including at least one Quantum Well (QW), the method including the step of:

causing an impurity material to intermix with the at least one Quantum Well, wherein the impurity material at least includes Copper (Cu).

The impurity material may substantially comprise Copper or an alloy thereof.

It has surprisingly been found that Copper diffuses around $10^6$ times faster than previously used impurities such as Zinc (Zn).

Preferably the method includes a preceding step of depositing on or adjacent the device body portion a layer including the impurity material.

In a first embodiment the impurity material may be incorporated with a carrier material. The carrier may be a dielectric material such as Silica ($SiO_2$) or Aluminum Oxide ($Al_2O_3$). In such case the layer may be deposited directly upon a surface of the device body portion, eg by sputtering.

In this first embodiment, the layer may be deposited by use of a diode or magnetron sputterer.

In a second embodiment the layer may comprise a layer of the impurity material which may be deposited adjacent a surface of the device body portion upon a spacer layer. The spacer layer may comprise a dielectric material such as Silica ($SiO_2$) or Aluminum Oxide ($Al_2O_3$).

A further layer, eg a further dielectric layer may be deposited on the layer.

In this second embodiment, the layer may be deposited by use of sputtering and the spacer layer and optional further layer may be deposited by use of sputtering or another technique, eg PECVD.

Preferably the method also includes the yet further preceding steps of:
  providing a substrate;
  growing on the substrate:
    a first optical cladding layer;
    a core guiding layer including the at least one Quantum Well (QW);
    a second optical cladding layer; and
    optionally a contact layer.

The first optical cladding layer, core guiding layer, second optical cladding layer and contact layer may be grown by Molecular Beam Epitaxy (MBE) or Metal Organic Chemical Vapour Deposition (MOCVD).

In a modification to the first embodiment the layer may be removed from the device body portion prior to intermixing.

Preferably the impurity material is caused to intermix with the at least Quantum Well (QW) by raising the device body portion to an elevated temperature for a predetermined time.

The elevated temperature may be in the region 700° C. to 950° C., while the predetermined time may be in the region of 30 seconds to 300 seconds.

The step of raising the device body portion to an elevated temperature may comprise annealing of the device body portion, which causes diffusion into the at least one Quantum Well of impurity material and out diffusion of ions or atoms from the Quantum Wells to the carrier material or spacer layer.

Preferably the method includes the step of:
  causing the impurity material to diffuse into the device body portion and also material (eg ions or atoms) of the device body portion to diffuse out and into a further material.

This therefore advantageously combines impurity induced and impurity free intermixing.

In one embodiment the further material may be a dielectric material such as Silica ($SiO_2$) or Aluminum Oxide ($Al_2O_3$).

Preferably the method includes the steps of:
  patterning a surface of the device body portion with a plurality of areas of the impurity material, at least two of the areas of impurity material being spaced from the surface by different amounts;
  causing the impurity material of the plurality of areas to intermix with the at least one Quantum Well so as to tune a band-gap of the intermixed at least one Quantum Well in the at least two areas to different values.

According to a second aspect of the present invention there is provided an optical device fabricated from a method according to the first aspect of the present invention.

The optical device may be an integrated optical device or an optoelectronic device.

The device body portion may be fabricated in a III–V semiconductor materials system.

The III–V semiconductor materials system may be a Gallium Arsenide (GaAs) based system, and may operate at a wavelength or wavelengths of substantially between 600 nm and 1300 nm. Alternatively, the III–V semiconductor materials system may be an Indium Phosphide based system, and may operate at a wavelength or wavelengths of substantially between 1200 nm and 1700 nm. The device body portion may be made at least partly from Aluminium Gallium Arsenide (AlGaAs), Indium Gallium Arsenide (InGaAs), Indium Gallium Arsenide Phosphide (InGaAsP), Indium Gallium Aluminium Arsenide (InGaAlAs) and/or Indium Gallium Aluminum Phosphide (InGaAlP).

The device body portion may comprise a substrate upon which are provided a first optical cladding layer, a core guiding layer, and a second optical cladding layer and optionally a contact layer.

At least one Quantum Well (QW) may be provided within the core guiding layer.

Alternatively, or additionally, at least one Quantum Well (QW) may be provided within one or both of the cladding layers. It will be appreciated by the reader that in the latter case one is likely more interested in tuning the refractive index rather than the band-gap of the cladding layer(s).

The core guiding layer, as-grown, may have a smaller band-gap and higher refractive index than the first and second optical layers.

According to a third aspect of the present invention there is provided an optical integrated circuit, optoelectronic integrated circuit (OEIC), or photonic integrated circuit (PIC) including at least one optical device according to the second aspect of the present invention.

According to a fourth aspect of the present invention there is provided a device body portion ("sample") when used in a method according to the first aspect of the present invention.

According to a fifth aspect of the present invention there is provided a wafer of material including at least one device body portion when used in a method according to the first aspect of the present invention.

BRIEF DESCRIPTION OF DRAWINGS

Embodiments of the present invention will now be described, by way of example only, and with reference to the accompanying drawings which are:

Figure 1A:
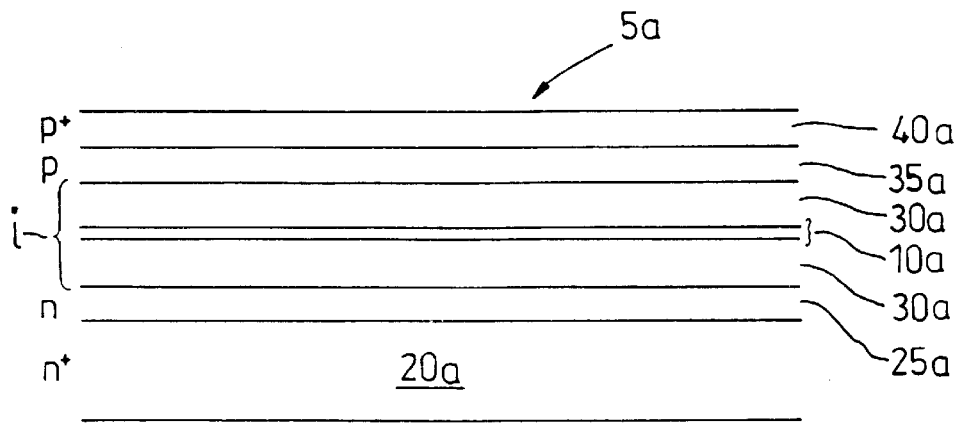
Figure 1B:
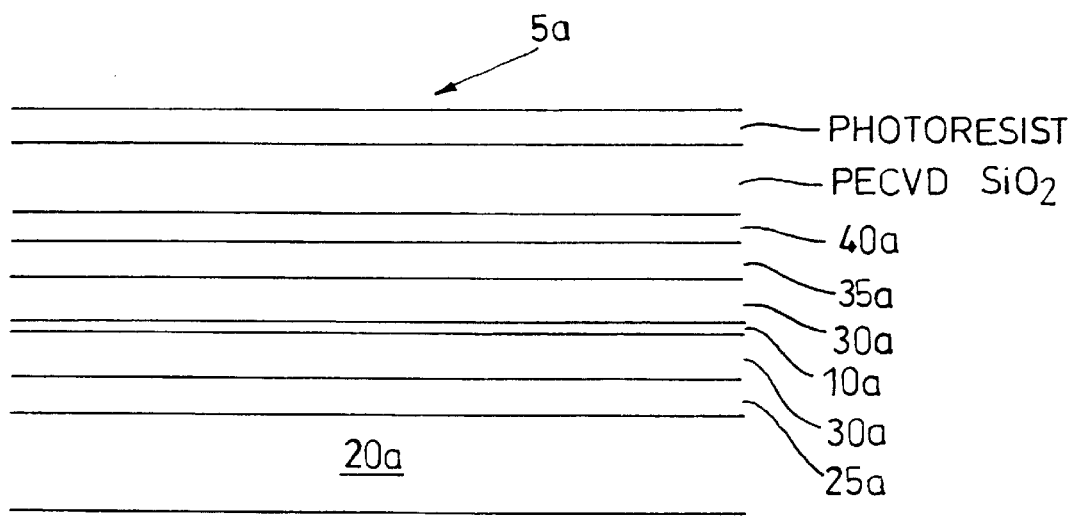
Figure 1C:
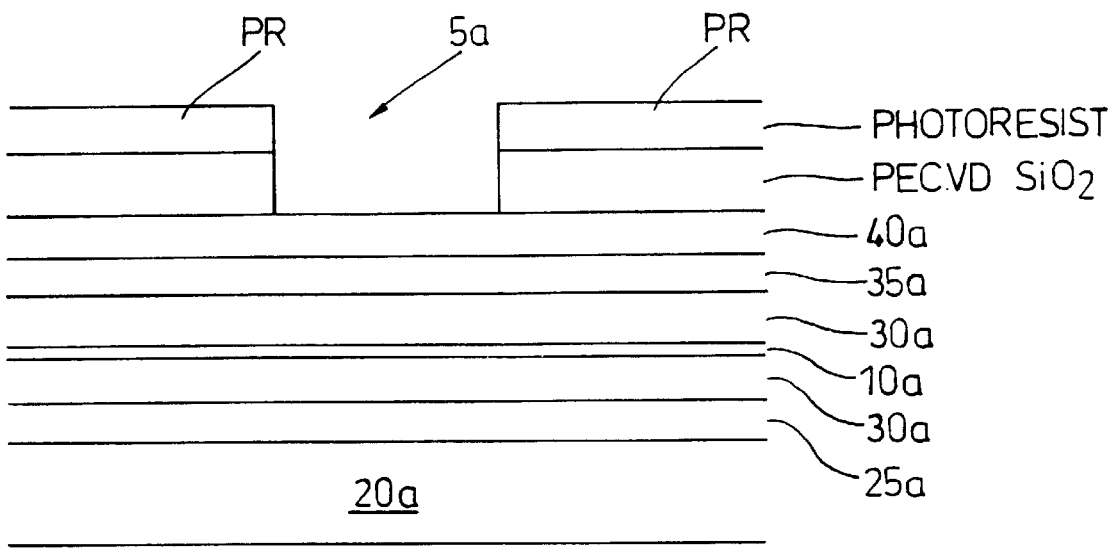
Figure 1D:
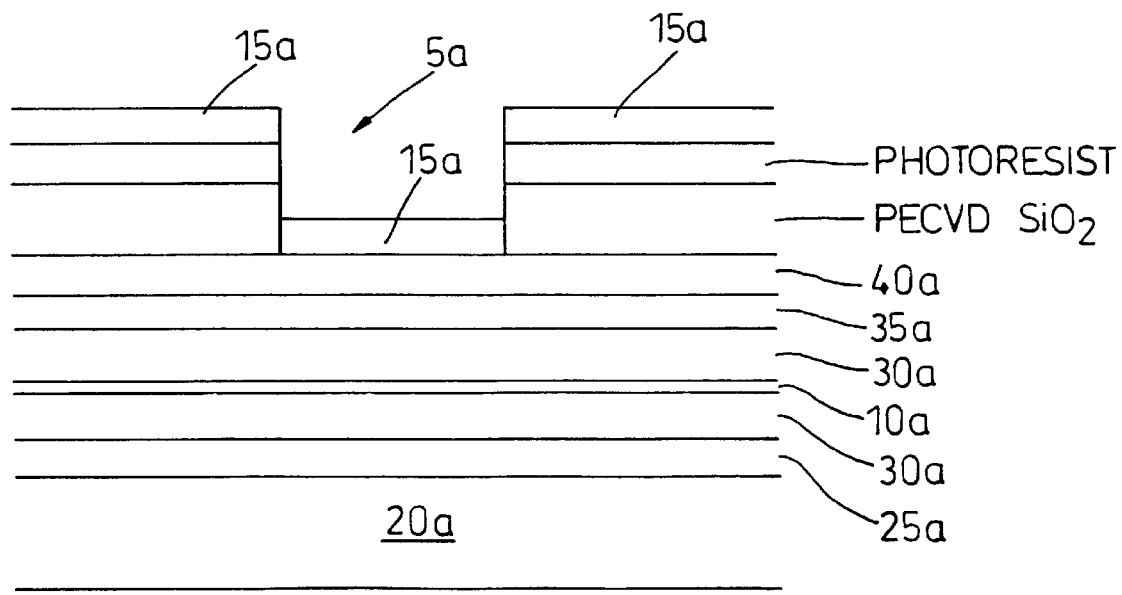
Figure 1E:
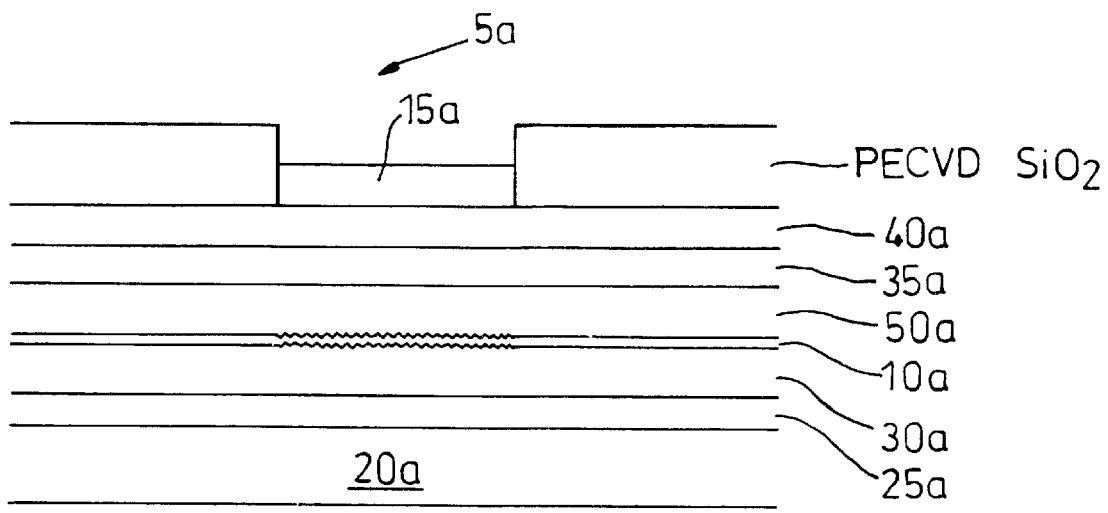
Figure 1F:
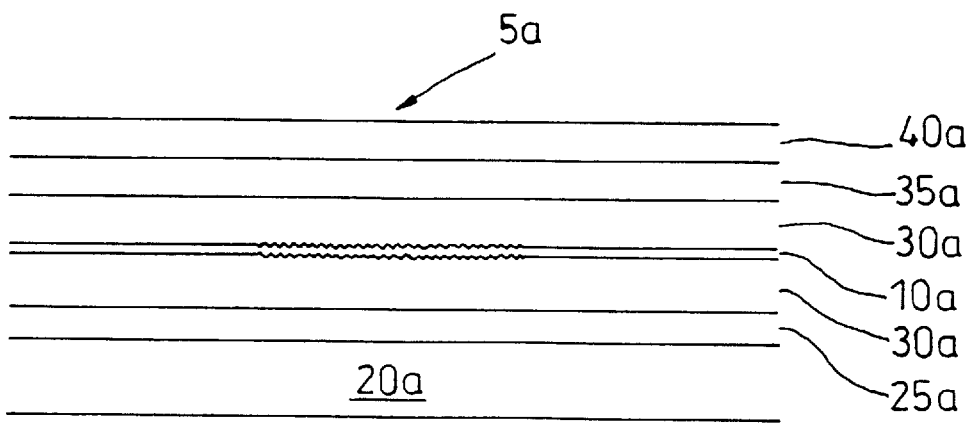
Figure 2:
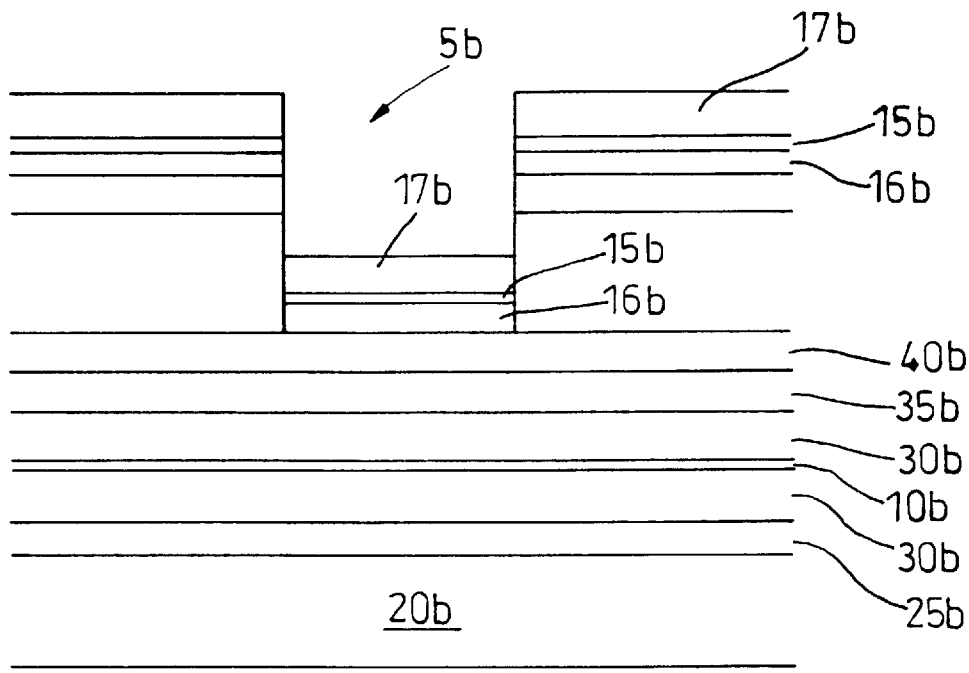
Figure 3:
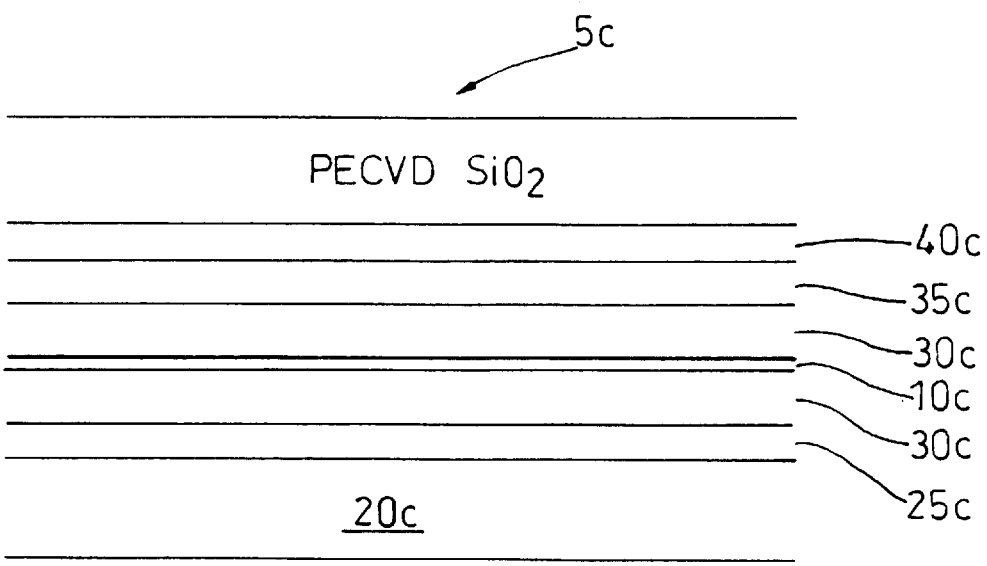
Figure 4:
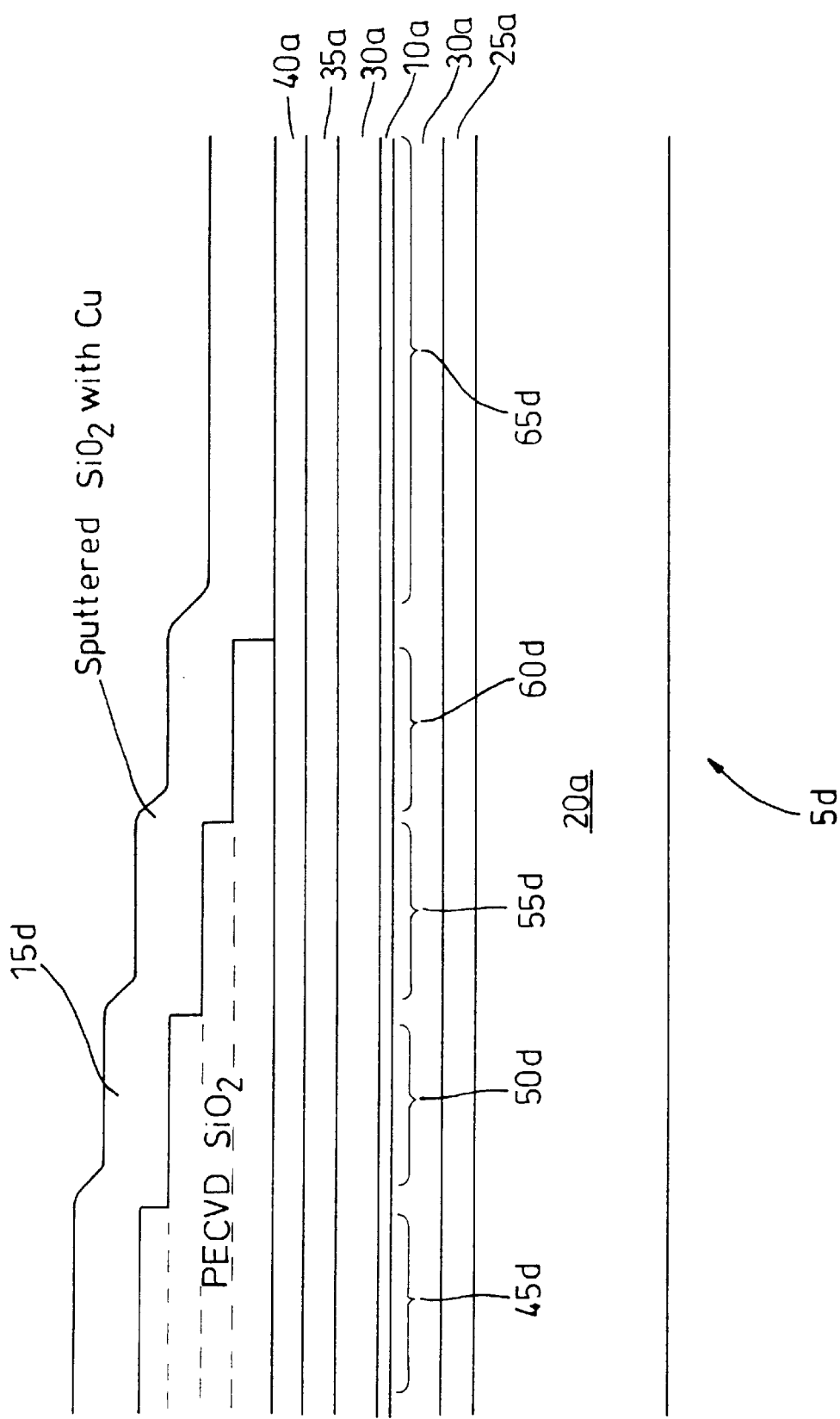

| | |
|---|---|
| FIGS. 1(a) to (f) | a series of schematic side sectional views of processing steps involved in a method of manufacturing an optical device according to a first embodiment of the present invention; |
| FIG. 2 | a schematic side sectional view of a processing step involved in a method of manufacturing an optical device according to a second embodiment of the present invention; |
| FIG. 3 | a schematic side sectional view of a processing step involved in a method of manufacturing an optical device according to a third embodiment of the present invention; |
| FIG. 4 | a schematic side sectional view of a processing step involved in a |

-continued

Figure 5:
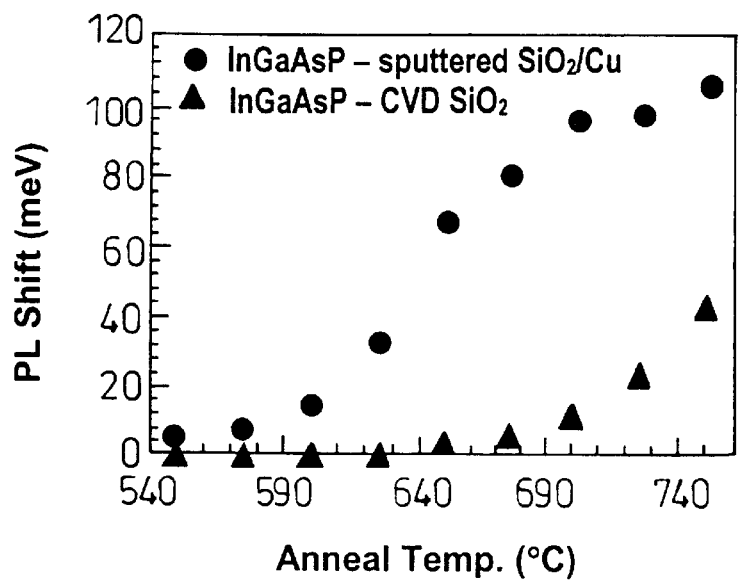
Figure 6:
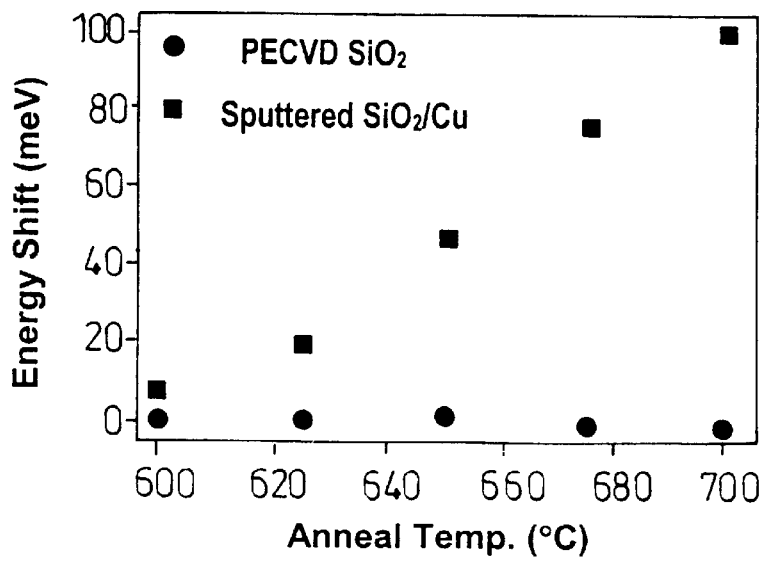
Figure 7:
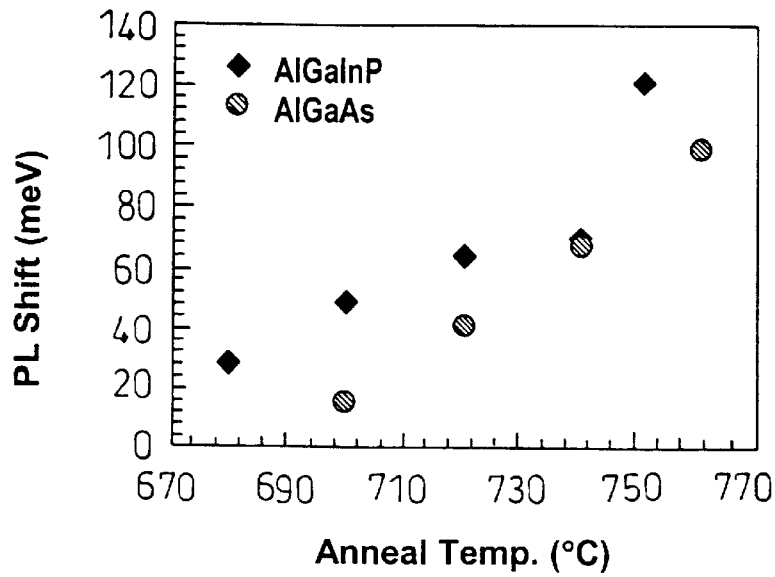
Figure 8:
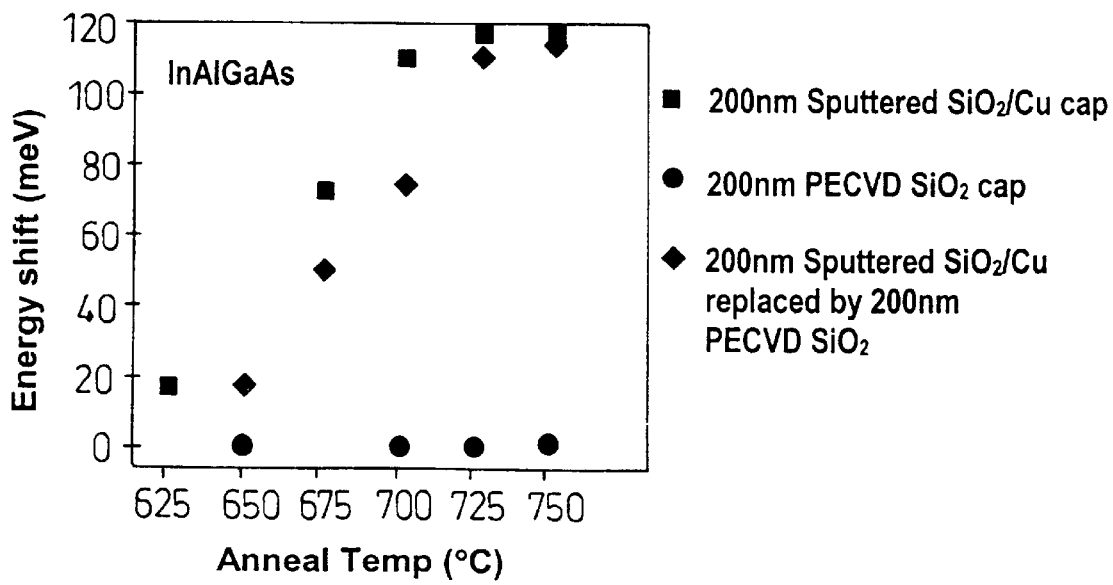
Figure 9:
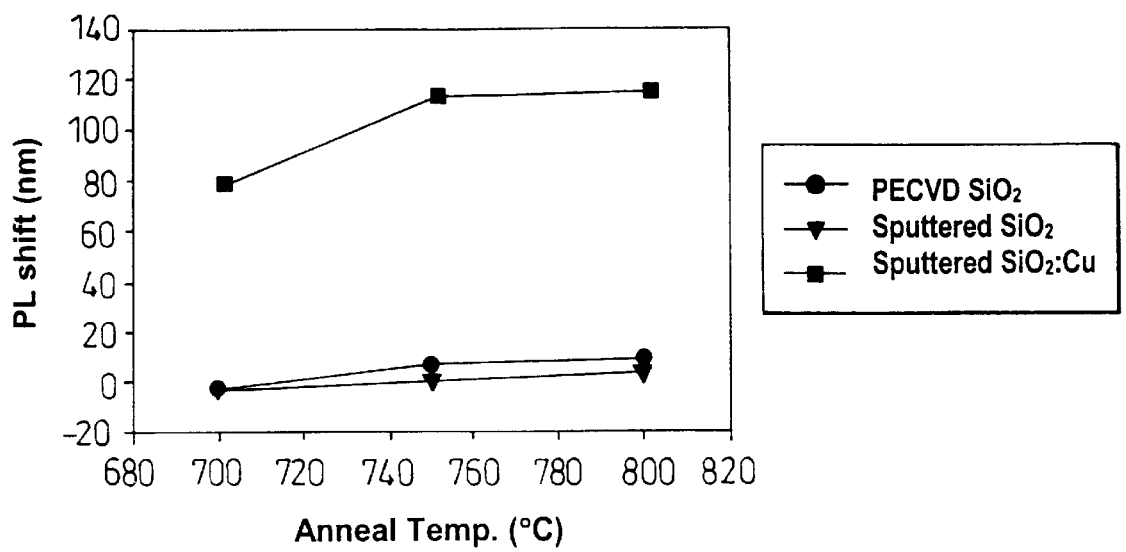
Figure 10:
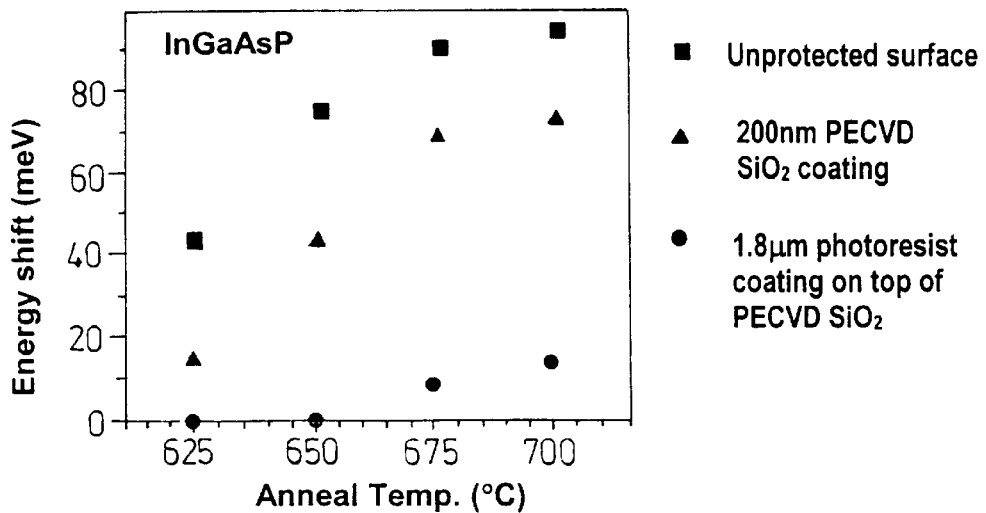
Figure 11:
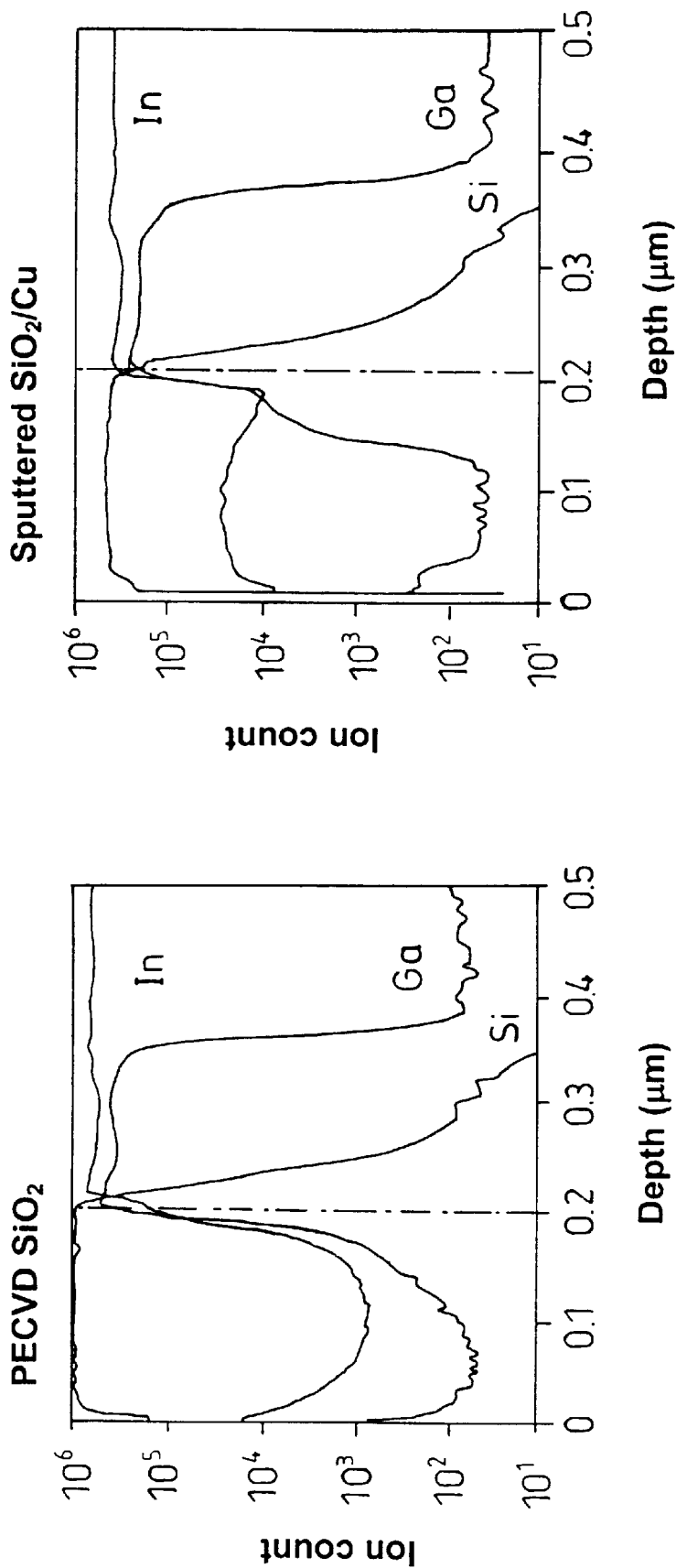
Figure 12:
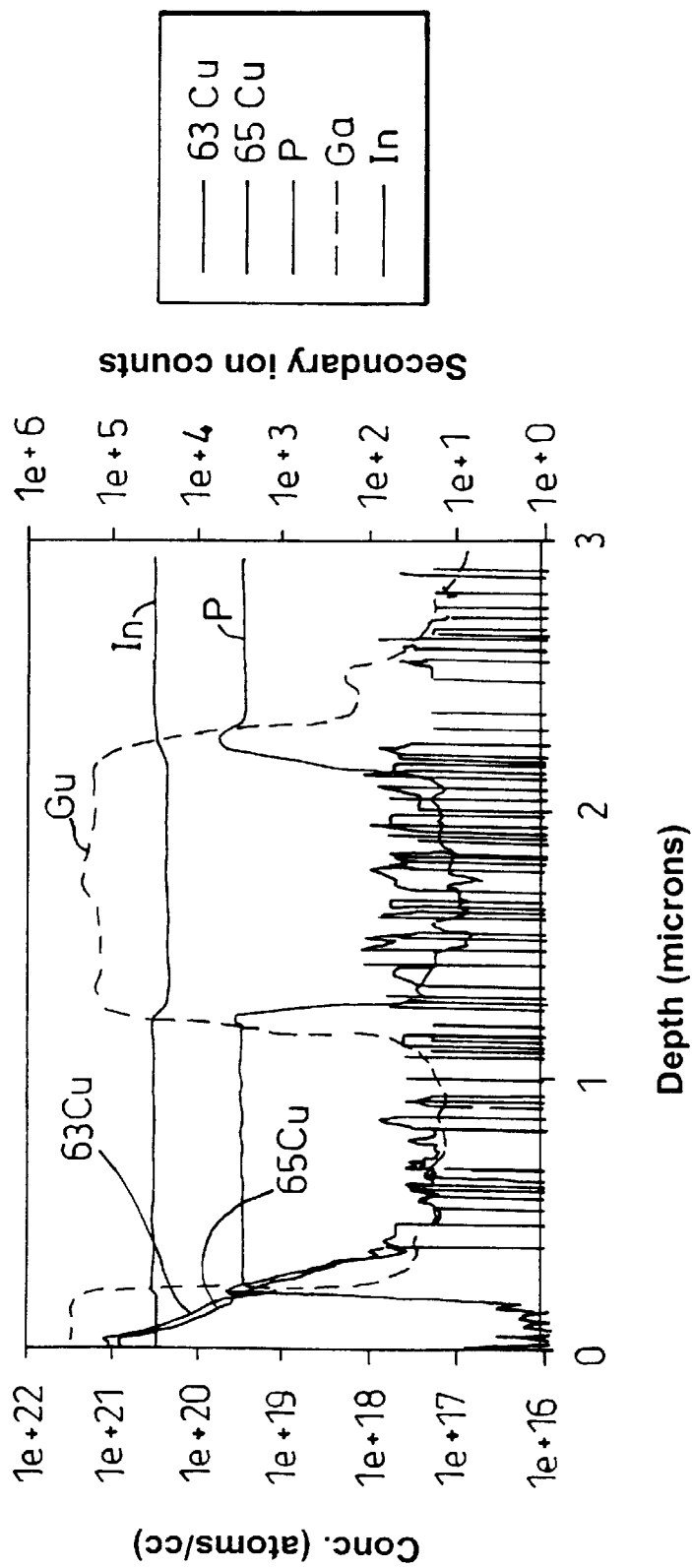
Figure 13:
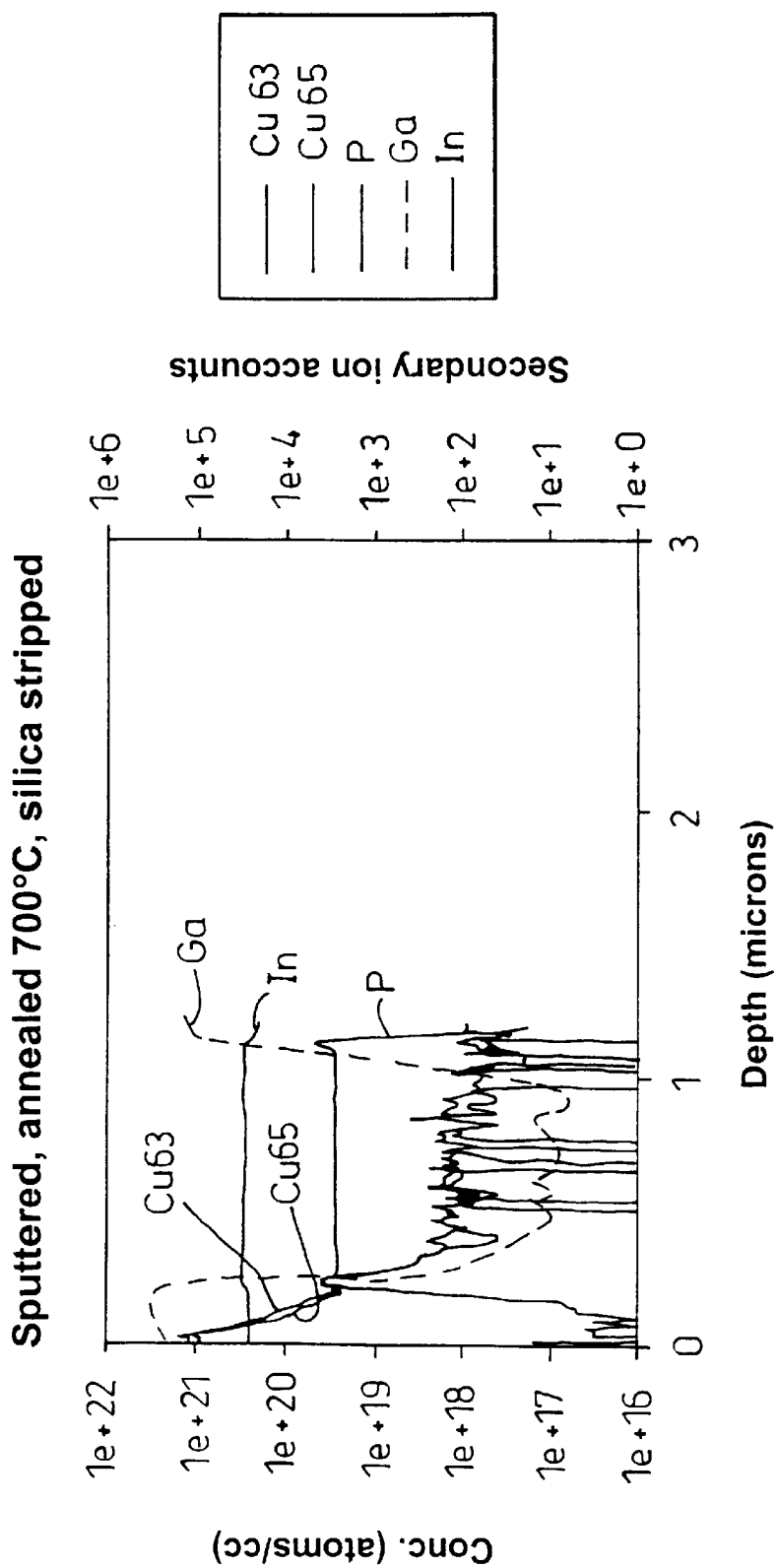
Figure 14:
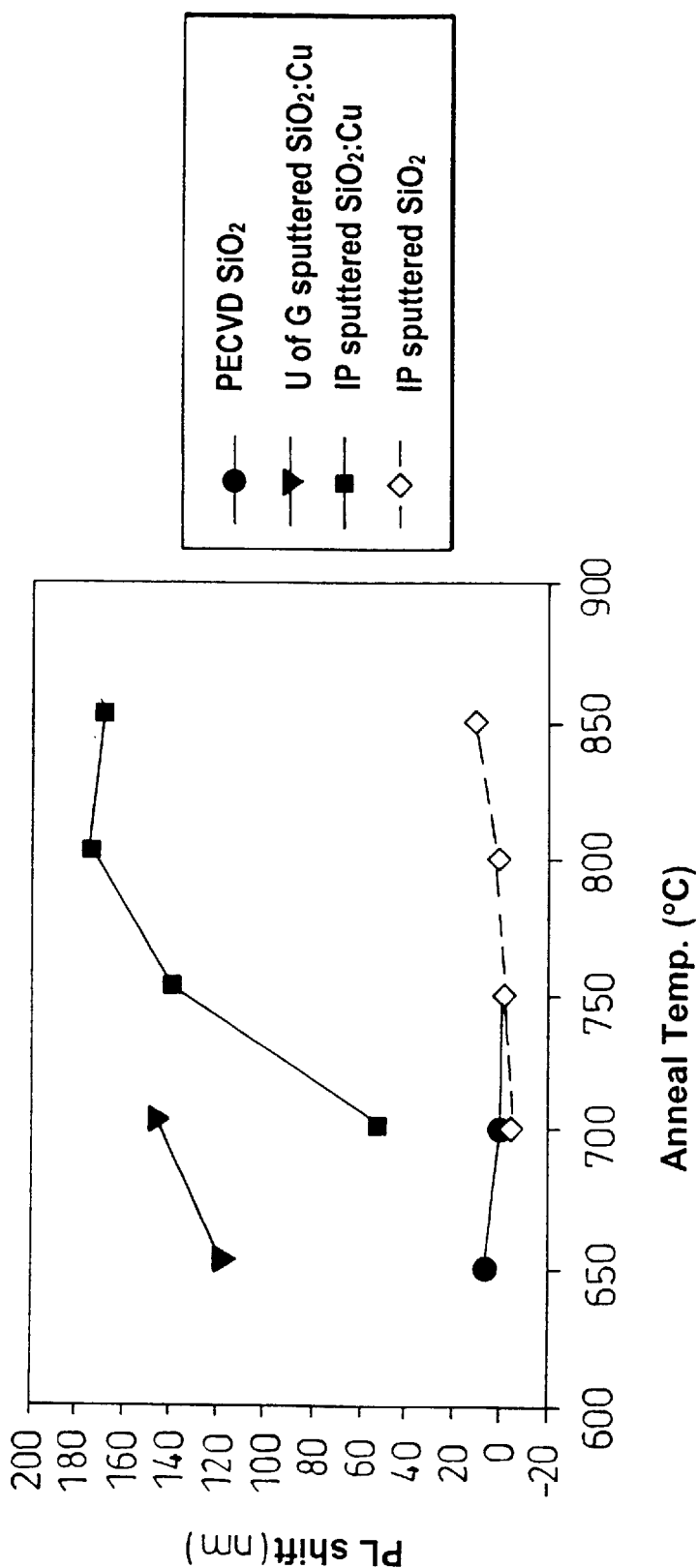
Figure 15:
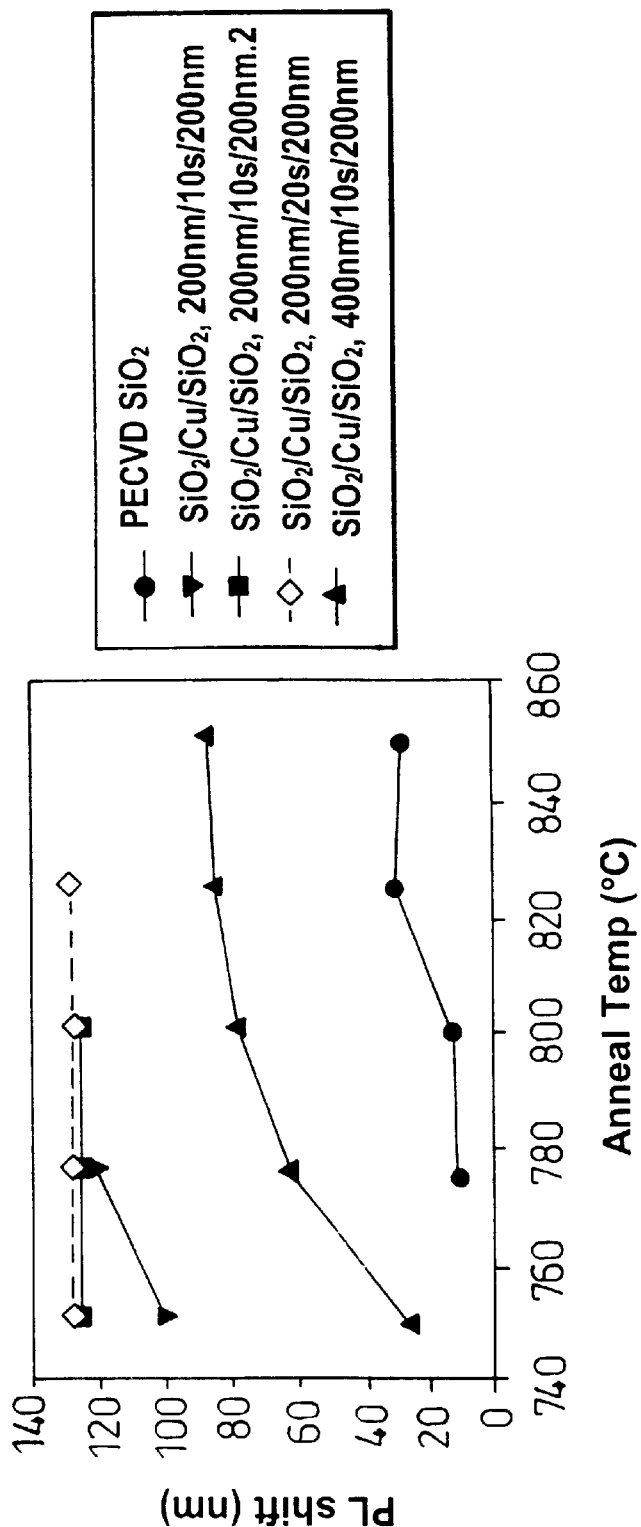
Figure 16:
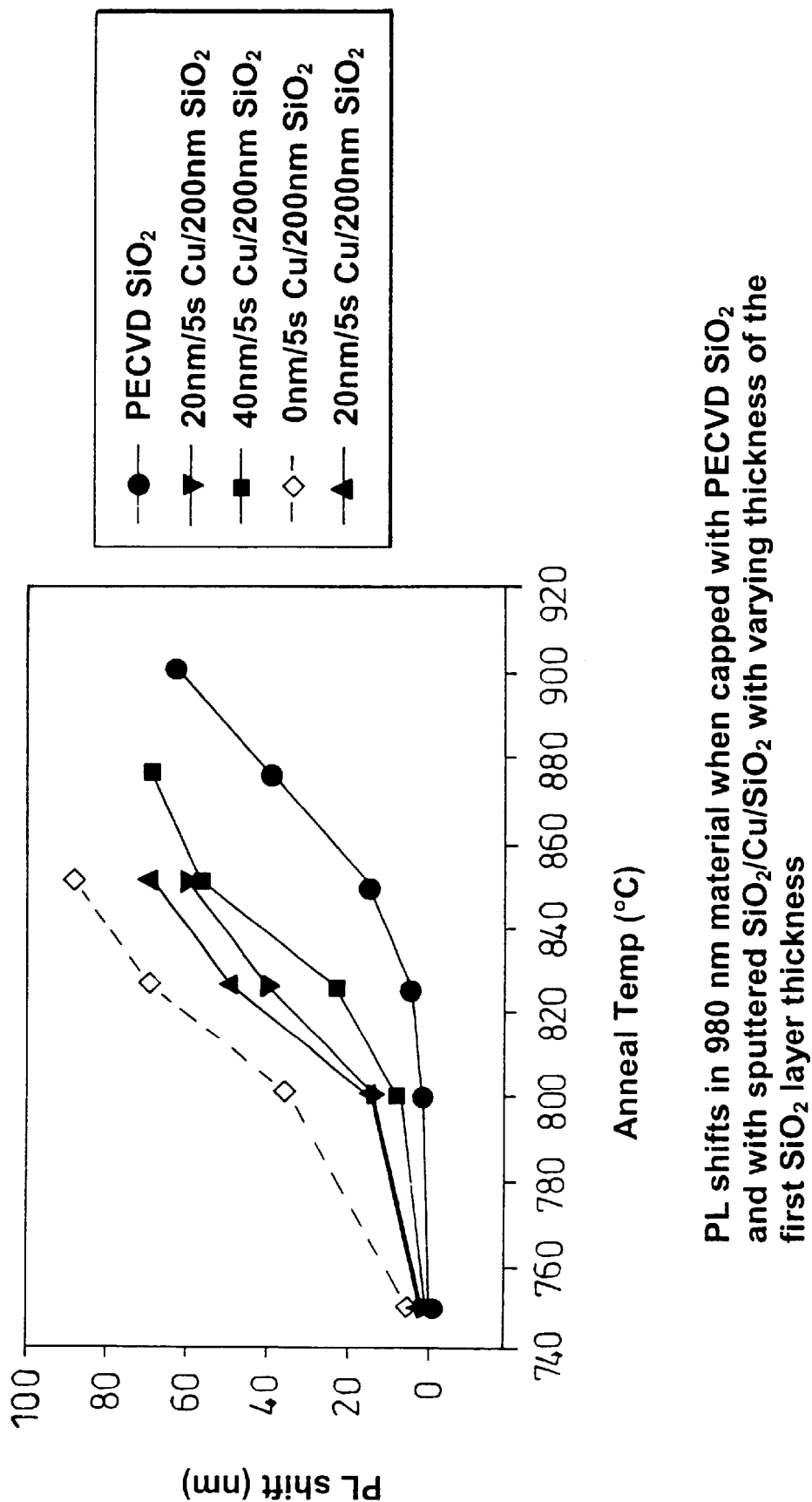

| | |
|---|---|
| | method of manufacturing an optical device according to a fourth embodiment of the present invention; |
| FIG. 5 | band-gap shift against anneal temperature for first samples according to an embodiment of the present invention; |
| FIG. 6 | band-gap shift against anneal temperature for second samples according to an embodiment of the present invention; |
| FIG. 7 | band-gap shift against anneal temperature for third and fourth samples according to an embodiment of the present invention; |
| FIG. 8 | band-gap shift against anneal temperature for fifth samples according to an embodiment of the present invention; |
| FIG. 9 | band-gap shift against anneal temperature for sixth samples according to an embodiment of the present invention; |
| FIG. 10 | band-gap shift against anneal temperature for seventh samples according to an embodiment of the present invention; |
| FIGS. 11(a) and (b) | ion count against depth for samples according to an embodiment of the present invention; |
| FIG. 12 | ion/atom count against depth for samples according to an embodiment of the present invention; |
| FIG. 13 | ion/atom count against depth for samples according to an embodiment of the present invention; |
| FIG. 14 | band-gap shift against anneal temperature for eighth samples according to an embodiment of the present invention; |
| FIG. 15 | band-gap shift against anneal temperature for ninth samples according to an embodiment of the present invention; and |
| FIG. 16 | band-gap shift against anneal temperature for tenth samples according to an embodiment of the present invention. |

DETAILED DESCRIPTION OF DRAWINGS

Referring initially to FIGS. 1(a) to (f) there is illustrated a method of manufacturing an optical device according to a first embodiment of the present invention. A device body portion, generally designated 5a, from which the device is to be made includes at least one Quantum Well (QW) structure 10a. The method includes the step of: causing an impurity material to intermix with the at least one Quantum Well 10a, wherein the impurity material includes Copper (Cu), see FIG. 1(e). The impurity material substantially comprises Copper or an alloy thereof in this embodiment. It has been surprisingly found that Copper diffuses around $10^6$ times faster than previously used impurities such as zinc (Zn).

As can be seen from FIG. 1(d), the method includes a preceding step of depositing on or adjacent the device body portion 5a a layer 15a including the impurity material.

In this embodiment the impurity material is incorporated within a carrier material. The carrier material in this embodiment is a dielectric material such as Silica ($SiO_2$) or Aluminium Oxide ($Al_2O_3$). In such case the layer 15a is deposited directly upon a surface of the device body portion 5a. The layer 15a is beneficially deposited by use of a diode or magnetron sputterer (not shown).

The method begins with the step of providing a substrate 20a, growing on the substrate 20a a first optical cladding layer 25a, a core guiding layer 30a including the at least one Quantum Well structure 10a, a second optical cladding layer 35a and optionally a contact layer 40a. The substrate 20a is typically doped $n^+$, while the first optical cladding layer 25a is doped n-type, the core guiding layer 30a being substantially intrinsic, the second optical cladding layer 35a being doped p-type and the contact layer 40a $p^+$.

It will be appreciated that the first optical cladding layer 25a, core guiding layer 30a, second optically cladding layer 35a and contact layer 40a may be grown by any suitable growth technique such as Molecular Beam Epitaxy (MBE) or Metal Organic Vapour Deposition (MOCVD).

Referring to FIG. 1(e), the impurity material 15a is caused to intermix with the at least one Quantum Well 10a by raising the device body portion 5a to an elevated temperature for a predetermined time. Typically the elevated temperature is in the region of 700° C. to 950° C., while the predetermined time is in the region of 30 seconds to 300 seconds. The raising of the device body portion 5a to an elevated temperature in this embodiment comprises annealing of the device body portion 5a which causes diffusion of the Copper into the at least one Quantum Well 10a, and further out-diffusion of ions or atoms such as Gallium from the at least one Quantum Well 10a into the carrier material of layer 15a. This embodiment therefore combines impurity induced and impurity free intermixing of the at least one Quantum Well 10a.

In summary, the method of this first embodiment comprises the following steps:

(a) providing the device body portion 5a (see FIG. 1(a));

(b) depositing on the device body portion 5a by PECVD a Silica layer and spinning a layer of photoresist onto the PECVD Silica layer (see FIG. 1(b));

(c) patterning the photoresist and PECVD Silica layer by lithography techniques, eg HF etch or $C_2F_6$ dry etch (see FIG. 1(c));

(d) depositing on the patterned device body portion 5a the layer 15a including the impurity material (see FIG. 1(d)).

(e) rapid thermal annealing of the device body portion 5a to a predetermined temperature for a predetermined time so as to intermix portions of the at least one Quantum Well 10a at predetermined patterned areas (see FIG. 1(e)); and (f) removing the various layers from the device body portion 5a and conveniently forming metalisations on the device body portion 5a so as to form electrical contacts thereto (see FIG. 1(f)).

Referring now to FIG. 2 there is illustrated a method of manufacturing an optical device according to a second embodiment of the present invention. This second embodiment differs from the first embodiment disclosed hereinbefore in that at the step of FIG. 1(d) rather than depositing a single layer of material 15a including the intermixing material, a layer 15b comprising a layer of impurity material is deposited adjacent the surface of the device body portion 5b upon a spacer layer 16b. The spacer layer 16b conveniently comprises a dielectric material such as Silica ($SiO_2$) or Aluminium Oxide ($Al_2O_3$). A further layer 17b, eg a further dielectric layer, is deposited on the layer 15b. In this second embodiment, the layer 15b is beneficially deposited by use of sputtering, and the spacer layer 16b and/or further layer 17b are beneficially deposited by use of sputtering or PECVD.

Referring now to FIG. 3 there is illustrated a method of manufacturing an optical device according to a third embodiment of the present invention. The method according to the third embodiment is similar to the method according to the first embodiment except that after the step shown in FIG. 1(d) the various layers including the layer (not shown) are removed from the device body portion 5c and a PECVD Silica layer is deposited on a surface of the device body portion 5c. The device body portion 5c is thereafter rapidly thermal annealed as in FIG. 1(e). It has been surprisingly found that intermixing of the at least one Quantum Well 10c by the intermixing material (eg Copper) still occurs in the embodiment of FIG. 3 even though the layer 15c has been removed prior to rapid thermal annealing.

Referring now to FIG. 4 there is illustrated a sectional side view of a processing step involved in a method of manufacturing an optical device according to a fourth embodiment of the present invention. As can be seen from FIG. 4, in this embodiment the device body portion 5d undergoes repeated patterning so as to provide a plurality of PECVD Silica layers so as to provide a stepped Silica pattern. The pattern including an exposed area of surface of the device body portion 5d without a PECVD Silica layer is shown in FIG. 4. On top of the PECVD Silica layered pattern is deposited by sputtering a layer 15d, including the impurity material. In this embodiment the layer 15d comprises a carrier material such as Silica including the impurity material, ie Copper. The device body portion 5d so patterned is then rapidly thermal annealed as shown in FIG. 1(e) so as to provide a plurality of intermixed Quantum Well areas 45d, 50d, 55d, 60d, 65d within the device body portion 5d each intermixed Quantum Well area being tuned to a different band-gap since the intermixing induced by the Copper impurity material is different in each Quantum Well intermixed area since each Quantum Well intermixed area 45d to 65d is spaced by a different amount by the PECVD Silica stepped layers from the layer 15d.

In summary the impurity induced Quantum Well Intermixing methods or processes of the present invention may employ a Silica film doped with Copper to introduce a controlled amount of impurity into the semiconductor. It has been found that Copper is a particularly effective impurity for impurity induced disordering. This is because Copper sits on both interstitial and substitutional sites and hops between them via the "kick-out" mechanism. It possesses an extremely high diffusion coefficient, which means that intermixing takes place rapidly and, furthermore, the Copper diffuses rapidly leaving a low residual concentration in the intermixed layer. In addition, by incorporating the Copper within a $SiO_2$ cap, the effect of out-diffusion of Group III elements into the cap is induced during the high temperature anneal, thereby generating additional Group III vacancies which further enhance the rate of intermixing. The technique has been demonstrated as an effective means of achieving large differential band-gap shifts in a wide range of III–V material systems and can be utilized to provide low passive section losses in a number of monolithically integrated devices including high power lasers with non-absorbing mirrors, extended cavity lasers and cross-point switches.

Only a very small quantity of Copper (around 1 monolayer) is required to induce Quantum Well Intermixing. It would likely be undesirable to evaporate a layer of Copper directly onto the semiconductor surface, as the local concentration of Copper would be very high and nonlinear diffusion effects resulting from the high concentration, such as spiking and clustering, could occur. Furthermore, the semiconductor surface needs to be protected by a dielectric cap during annealing, and the use of $SiO_2$ encapsulation provides the additional benefit of promoting Group III vacancy creation via atomic outdiffusion.

In the method of the present invention, Copper can be introduced into the semiconductor by diffusion from a layer of Copper doped Silica. The layer is deposited using a diode or magnetron sputtering system and may be uniformly doped by simultaneously sputtering the Copper and $SiO_2$ (first embodiment) or the Copper may be incorporated in a single pure layer back-spaced from the semiconductor surface by a thin $SiO_2$ film (second embodiment). The latter approach appears to offer greater control over the level of Copper incorporation within the semiconductor. Typically, a thin layer (20 nm to 2000 nm) of undoped Silica is deposited, followed by around 1 to 3 monolayers of Copper. The structure is then completed by a further deposition of undoped Silica. The sample is then annealed at temperatures in the range 700° C. to 950° C. for 30 seconds to 300 seconds, depending on the material. During the annealing stage Copper diffuses from the Silica layer into the semiconductor. Copper has an extremely high diffusion coefficient in the semiconductor, which means that intermixing takes place rapidly. Furthermore, the Copper diffuses rapidly into the device body leaving a low residual concentration in the intermixed layer.

A number of examples of experimental samples fabricated by methods falling within the first to third embodiments hereinbefore described will now be given.

All samples studied were full p-i-n multilayer laser structures grown either by Molecular Beam Epitaxy (MBE) or Metal-Organic Vapour Phase Epitaxy (MOVPE) on GaAs or InP substrates. The epi-layers typically comprised an active region containing one or more Quantum Wells (QWs), generally 3 nm to 10 nm thick, within a higher band-gap waveguide core, 250 nm to 1000 nm thick which was surrounded by p-doped and n-doped cladding layers. The structures were all capped with a highly p-doped ($1 \times 10^{19}$ $cm^{-3}$) contact layer, typically 100 nm to 300 nm thick.

EXAMPLE 1

The following results were obtained with an initial sample. The Copper was incorporated in a $SiO_2$ matrix, typically 200 nm thick, by simultaneously sputtering both the Copper and the $SiO_2$. This was achieved by reducing the height of the earth shield around the target so that part of the targets Copper backing plate was eroded. The degree of Quantum Well Intermixing induced by this process was determined by measuring the change in photoluminescence (PL) energy after annealing. In all cases this was compared against a control sample coated with PECVD $SiO_2$, and all anneals were performed for 60 seconds unless otherwise stated.

FIG. 5 shows initial results obtained in MOVPE-grown InGaAs—InGaAsP emitting at 1550 nm for samples capped with PECVD $SiO_2$ and sputtered $Cu:SiO_2$. While samples capped with PECVD $SiO_2$ show initial band-gap shifts at temperatures of 650° C., significant band-gap shifts are obtained in $Cu:SiO_2$ capped material at temperatures approximately 100° C. lower enabling differential band-gap shifts of 80 meV to be obtained at anneal temperatures of 650° C. to 675° C.

EXAMPLE 2

A similar embodiment is obtained in the InGaAs—InAlGaAs materials systems, emitting at 1550 nm as shown in FIG. 6 for material grown by MBE. This material had a larger thermal stability than InGaAsP as evidenced by the negligible shifts obtained under PECVD $SiO_2$. Using $Cu:SiO_2$ however, shifts were initially obtained at 600° C. and increase to over 100 meV for anneal temperatures of 700° C.

EXAMPLES 3 AND 4

Band-gap shifts of similar magnitude were also obtained using sputtered $Cu:SiO_2$ films in GaAs—AlGaAs (850 nm to 860 nm) and GaInP—AlGaInP (670 nm) MQW structures, as shown in FIG. 7. Here PECVD $SiO_2$ capped samples again yield negligible band-gap shifts over the temperature range used and for clarity are omitted from FIG. 7. Over the same temperature range, negligible shifts were obtained for both materials when capped with PECVD $SiO_2$.

EXAMPLES 5 AND 6

Investigations showed that large ban d-gap shifts could also be obtained after removal of the sputtered $Cu:SiO_2$ cap and replacement with PECVD $SiO_2$ prior to the high temperature anneal. The typical effect observed in InGaAs—InAlGaAs is shown in FIG. 8. Investigations showed through secondary ion mass spectroscopy (SIMS) measurements and experiments on the sputtering system, that the predominant mechanism for enhancement was the incorporation of significant levels of Cu within the semiconductor surface during the initial stages of sputtering. This is illustrated in FIG. 9 which shows band-gap shifts obtained in InAlGaAs material for samples coated with both sputtered $SiO_2$ and $Cu:SiO_2$, compared with samples coated with PECVD $SiO_2$ and undoped $SiO_2$ PECVD $SiO_2$. This shows very similar behaviour for PECVD $SiO_2$ and undoped $SiO_2$ whereas large differential shifts (>100 nm) are obtained using sputtered $Cu:SiO_2$.

EXAMPLE 7

Suppression of the intermixing was found to be possible by protecting the sample surface during the sputtering process with layers of PECVD $SiO_2$, with the degree of suppression being larger for thicker protective coatings. This is shown in FIG. 10, for InGaAs—InGaAsP.

This observation suggests that the Cu diffuses through these thin $SiO_2$ layers during the high temperature anneal giving rise to significant concentrations within the upper layers of the sample. This deposition technique should provide a greater degree of control over the Cu concentration and has proved useful in obtaining a range of different band-gaps with a single sputter and anneal stage by suitable patterning of the sample. This approach also appears to provide an improvement in the quality of the processed material, presumably due to a reduction in the Cu concentration within the active region of the semiconductor. As shown in FIG. 10, complete intermixing suppression is possible using a relatively thick layer of photoresist, with the shifts shown for resist protected material being identical to those obtained with PECVD $SiO_2$ capped material. This improvement in suppression may be ascribed to both the increase in thickness of the diffusion barrier and the decrease in Copper diffusion rate within the resist.

Secondary ion mass spectroscopy (SIMS) and Rutherford back scatterings (RBS) measurements were also used to determine the atomic composition of the $SiO_2$ films and to measure the extent of any Group III out-diffusion within them. For both InGaAsP and InAlGaAs material they showed clear signs of out-diffusion of both In and Ga from the semiconductor surface into the sputtered $SiO_2$:Cu cap at temperatures at which no out-diffusion was observed in a PECVD $SiO_2$ cap. This is clearly illustrated for InGaAsP Multiple Quantum Well (MQW) material in FIG. 11, and may be ascribed to a reduction in the activation temperature for out-diffusion in material doped with Cu, due to the increase in point defect density induced by Copper diffusion.

FIG. 11 illustrates SIMS profiles in InGaAsP MQW material capped with both PECVD $SiO_2$ and sputtered $Cu:SiO_2$ after a 680° C. anneal. In and Ga out-diffusion is clearly observed for the sputter capped material but is not apparent in the PECVD $SiO_2$ cap.

Subsequent measurements showed Copper distributed throughout the $SiO_2$ film with an average concentration of $1 \times 10^{21}$ cm$^{-3}$, with similar densities observed at the semiconductor surface, rapidly decreasing to a concentration of $1 \times 10^{18}$ cm$^{-3}$, at a depth of 300 nm, as shown in FIG. 12.

FIG. 12 illustrates SIMS profile of an unannealed InAlGaAs MQW sample after removal of a sputtered $Cu:SiO_2$ coating. The Cu concentration rapidly decreases to the noise limit of $5 \times 10^{17}$ cm$^{-3}$ at a depth of around 300 nm.

After annealing significant diffusion of the Cu appeared to occur, such that a concentration of $1 \times 10^{18}$ cm$^{-3}$ was obtained throughout the cladding layer and into the waveguide region, to a depth of over 1 µm, as shown in FIG. 13.

FIG. 13 illustrates SIMS profile in InAlGaAs sample after annealing at 700° C. and stripping of the $Cu:SiO_2$ cap.

In some of the examples the sputtering of $Cu:SiO_2$ was performed in a first single target diode sputtering system using an $Ar:O_2$(9:1) process gas and a sputtering pressure of $2 \times 10^{-3}$ mbar with an RF power of 110W, corresponding to a self dc bias of 1 kV. The dependence of the Copper induced intermixing process on the sputtering conditions was investigated in the early stages of the process development. Some initial results suggested a near linear dependence of the shift upon film thickness, however there were a number of conflicting early reports and later studies showed that there was little dependence on the thickness of the sputtered layer. This appears consistent with the intermixing observed after removal of the sputtered cap which implies that the effect is predominantly controlled by the early stages of film growth during which Copper is directly incorporated into the semiconductor. There appeared to be little dependence upon the RF sputtering power for powers below 110W (it was not possible to investigate higher powers, due to the likelihood of damage to the $SiO_2$ target), which is not too surprising given the significantly greater sputter yield of Copper compared to $SiO_2$, however a strong dependence of the QWI rate upon sputtering pressure was observed. It is likely, however, that this is an artifact of the simultaneous $Cu:SiO_2$ deposition process due to an increase in the thickness of the high voltage sheath with decreasing pressure, which prevents sputtering in the region of the earth sheath and the resultant erosion of the backing plate. Using pure Ar as the sputtering gas was also investigated, having no obvious effect upon the rate of intermixing.

EXAMPLE 8

In other samples, a second sputtering system was used which involved the use of the simultaneous sputtering of $SiO_2$ and Cu by manipulation of the height of an earth shield.

Using sputtering conditions largely identical to those described above this enabled large differential band-gap shifts to be generated compared to PECVD $SiO_2$. This is shown for InAlGaAs in FIG. 14, which also compares the band-gap shift obtained in the first sputtering system. FIG. 14 illustrates PL shifts obtained for InAlGaAs capped with PECVD $SiO_2$ sputtered $SiO_2$ and Cu:$SiO_2$ deposited in the second sputtering system and sputtered Cu:$SiO_2$ deposited in the first sputtering system. This shows that when no Copper is incorporated, band-gap shifts are identical to those obtained with PECVD $SiO_2$, however large differential shifts are obtained when Copper is deliberately incorporated. The degree of band-gap shift appeared to be slightly lower than that obtained in the first sputtering system, which may be explained by a slightly lower Copper incorporation level, probably caused by a reduced degree of exposure of the backing plate to the sputtering plasma.

EXAMPLE 9

A third embodiment utilising a multi-layer approach is now described. As described earlier, this involves incorporating the Copper within a thin film close to the semiconductor surface, but backspaced from the surface by a thin layer of sputtered $SiO_2$. The $SiO_2$ layers were sputtered using the standard conditions previously described, while the Copper layers were deposited at the same pressure but with a lower RF power of 25W to decrease the sputtering rate and provide greater control over the included Copper concentration. FIG. 15 shows some typical results in InAlGaAs using this method, and particularly band-gap shifts achieved through a $SiO_2$/Cu/$SiO_2$ multilayer deposition technique in InAlGaAs, where the second number refers to the deposition time for the Copper layer and the first and third values refer to the thicknesses of the surrounding $SiO_2$ layers. This shows that a thin layer of Copper (2 to 3 monolayers) backspaced 200 nm from the semiconductor surface can achieve large, apparently saturated band-gap shifts compared to PECVD $SiO_2$ capped samples. Increasing the thickness of the Copper film appears to provide no obvious increase in differential shift. However, using a Copper layer of the same thickness but doubling the backspacing to 400 nm increases the activation temperature for the QWI process, such that at 775° C. the differential shift is roughly half that for the 200 nm backspacing. Further optimization of the technique should involve balancing the degree of backspacing and thickness of the Copper film to ensure sufficient impurity incorporation to achieve a large differential band-gap shift with a minimum residual Copper concentration.

EXAMPLE 10

The above approach has also been successfully implemented in InGaAs—GaAs QW material emitting at 980 nm, as is shown in FIG. 16. FIG. 16 shows PL shifts in 980 nm material when capped with PECVD $SiO_2$ and with sputtered $SiO_2$/Cu/$Sio_2$ with varying thickness of the first $SiO_2$ layer thickness. Here it was apparent that the differential band-gap shift is largest for the layers in which the Copper is directly deposited onto the sample surface and decreases with increasing thickness of the $SiO_2$ backspacing layer. The degree to which the backspacing thickness can be increased is limited by the poor thermal stability of the material, which in turn limits the magnitude of the achievable differential band-gap shift. An increase in differential shift can be made simply by increasing the anneal times which can dramatically increase intermixing in the Copper doped films, while having little effect for PECVD $SiO_2$ layers.

It will be appreciated that the embodiments of the present invention hereinbefore described are given by way of example only, and are not meant to limit the scope of the invention in any way. In particular, it will be appreciated that modifications may be made to the disclosed embodiments while still falling within the scope of the invention.

What is claimed is:

1. A method of manufacturing an optical device, a device body portion from which the device is to be made including at least one Quantum Well (QW), the method including the steps of:

causing an impurity material to intermix with the at least one Quantum Well, wherein the impurity material at least includes Copper (Cu).

2. A method of manufacturing an optical device as claimed in claim 1, wherein the impurity material substantially comprises Copper or an alloy thereof.

3. A method of manufacturing an optical device as claimed in claim 1, wherein the method includes a preceding step of depositing on or adjacent the device body portion a layer including the impurity material.

4. A method, of manufacturing an optical device as claimed in claim 3, wherein the impurity material is incorporated with a carrier material.

5. A method of manufacturing an optical device as claimed in claim 4, wherein the carrier material is a dielectric material.

6. A method of manufacturing an optical device as claimed in claim 4, wherein the layer including the impurity material is deposited directly upon a surface of the device body portion.

7. A method of manufacturing an optical device as claimed in claim 6, wherein the layer is deposited by use of a sputtering apparatus.

8. A method of manufacturing an optical device as claimed in claim 4, wherein the layer is removed from the device body portion prior to intermixing.

9. A method of manufacturing an optical device as claimed in claim 3, wherein the layer comprises a layer of the impurity material which is deposited adjacent a surface of the device body portion upon a spacer layer.

10. A method of manufacturing an optical device as claimed in claim 9, wherein the spacer layer comprises a dielectric material.

11. A method of manufacturing an optical device as claimed in claim 9, wherein a further layer is deposited on the layer.

12. A method of manufacturing an optical device as claimed in claim 11, wherein the further layer comprises a further dielectric layer deposited by use of a sputtering apparatus.

13. A method of manufacturing an optical device as claimed in claim 9, wherein the layer is deposited by use of sputtering and the spacer layer is deposited by use of a sputtering apparatus.

14. A method of manufacturing an optical device as claimed in claim 3, wherein the method also includes the yet further preceding steps of:

providing a substrate;
growing on the substrate:
a first optical cladding layer;
a core guiding layer including the at least one Quantum Well (QW);
a second optical cladding layer; and
optionally a contact layer.

15. A method of manufacturing an optical device as claimed in claim 14, wherein the first optical cladding layer, core guiding layer, second optical cladding layer and contact layer are grown by Molecular Beam Epitaxy (MBE) or Metal Organic Chemical Vapour Deposition (MOCVD).

16. A method of manufacturing an optical device as claimed in claim 1, wherein the impurity material is caused to intermix with the at least one Quantum well (QW) by raising the device body portion to an elevated temperature for a predetermined time.

17. A method of manufacturing an optical device as claimed in claim 16, wherein the elevated temperature is in the region 700° C. to 950° C., and the predetermined time is in the region of 30 seconds to 300 seconds.

18. A method of manufacturing an optical device as claimed in claim 16, wherein the step of raising the device body portion to an elevated temperature comprises annealing of the device body portion, which causes diffusion into the at least one Quantum Well of impurity material and out diffusion of ions or atoms from the Quantum Wells.

19. A method of manufacturing an optical device as claimed in claim 1, wherein the method includes the step of:

causing the impurity material to diffuse into the device body portion and also material of the device body portion to diffuse out and into a further material.

20. A method of manufacturing an optical device as claimed in claim 19, wherein further material is a dielectric material.

21. A method of manufacturing an optical device as claimed in claim 1, wherein the method includes the steps of:

patterning a surface of the device body portion with a plurality of areas of the impurity material, at least two of the areas of impurity material being spaced from the surface by different amounts;

causing the impurity material of the plurality of areas to intermix with the at least one Quantum Well so as to tune a band-gap of the intermixed at least one Quantum Well in the at least two areas to different values.

* * * * *